United States Patent [19]

Choi

[11] Patent Number: 5,763,308
[45] Date of Patent: Jun. 9, 1998

[54] METHOD FOR FABRICATING FLASH MEMORY CELLS USING A COMPOSITE INSULATING FILM

[75] Inventor: Il Hyun Choi, Ichonkun, Rep. of Korea

[73] Assignee: Hyundai Electronics Industries Co., Ltd., Rep. of Korea

[21] Appl. No.: 499,082

[22] Filed: Jul. 6, 1995

[30] Foreign Application Priority Data

Jul. 6, 1994 [KR] Rep. of Korea .......... 1994-16141

[51] Int. Cl.$^6$ .......... H01L 21/8247
[52] U.S. Cl. .......... 438/261; 438/286; 438/954
[58] Field of Search .......... 437/42, 43, 241, 437/242, 920, 978; 148/DIG. 112, DIG. 114, DIG. 156; 438/257, 261, 286, 287, 591, 593, 763, 954

[56] References Cited

U.S. PATENT DOCUMENTS

| | | | |
|---|---|---|---|
| 4,780,424 | 10/1988 | Holler et al. | 437/43 |
| 4,795,719 | 1/1989 | Eitan | 437/43 |
| 4,852,062 | 7/1989 | Baker et al. | 437/43 |
| 5,219,773 | 6/1993 | Dunn | 437/42 |
| 5,324,675 | 6/1994 | Hayabuchi | 437/920 |
| 5,489,542 | 2/1996 | Iwai et al. | 437/42 |

Primary Examiner—Chandra Chaudhari
Attorney, Agent, or Firm—Blakely Sokoloff Taylor & Zafman

[57] ABSTRACT

A flash memory cell, comprising: a composite insulating film formed on a substrate at a predetermined size which charges are trapped or detrapped; a drain formed at one side of the composite insulating film; a source formed a predetermined distance away the other side of the composite insulating film; a program/erasure gate formed on the composite insulating film; an interlayer insulating film for covering the drain, the source and the program/erasure gate; a selecting gate formed on the interlayer insulating film, which is programmable and erasable at low voltages and operable by application of a single power system. In the cell, the low voltages allow peripheral circuit to be designed easily and the chip size to be reduced. Further, the repeating number of the programming and erasing can be markedly increased since the flash memory cell employs a channel erasure manner as well as low powers. It is preventive of overerasure and thus can erase information more quickly. Furthermore, the flash memory cell is relatively even in topology, to which processing difficulty is low owing.

10 Claims, 8 Drawing Sheets

FIG. 6

| | WL1 | WL2 | BL1 | BL2 | P/E1 | P/E2 | S1 | S2 | P-WELL |
|---|---|---|---|---|---|---|---|---|---|
| PROGRAM | 5V | 0V | -5V | 0V | +5V | 0V | -5V | 0V | -5V |
| ERASE | 5V | 0V | 5V | 0V | -5V | 0V | 5V | 0V | 5V |
| READ | 5V | 0V | 0V | FLOAT | 5V | 0V | 1V | 0V | 0V |

1

METHOD FOR FABRICATING FLASH MEMORY CELLS USING A COMPOSITE INSULATING FILM

BACKGROUND OF THE INVENTION

1. Field of the Invention

The present invention relates to flash memory cells and a method for fabricating the same. The present invention is concerned with a method for arraying the flash memory cells.

2. Description of the Prior Art

Flash memory cells are nonvolatile memory devices which are able to electrically record and erase information. For better understanding of the background of the present invention, a conventional flash memory cell will be described in conjunction with some drawings.

Referring to FIG. 1, there is shown a stack gate structure of a conventional flash memory cell. As shown in this figure, a floating gate 14 and a control gate 15 are stacked in an insulating film formed on a semiconductor substrate with a source 11 and a drain 12. The flash memory cell having such stack gate structure is typically programmed by applying a power of 5 to 7 volts to the drain and a power of 12 volts to the floating gate. At the moment it stores channel hot electrons generated near the drain 11.

In order to erase the stored electrons, a power of 12 volts or higher is applied to the source concurrently with the floating of the drain and the earthing of the control gate. However, this flash memory is significantly disadvantageous in many aspects owing to the stack structure on the surface of the substrate. For example, the asymmetric structure of the source and the drain causes an increase in cell area. In addition, a problem of overerasure arise, for which application of a complicated algorithm is needed to compensate. Accordingly, there is another problem that the erasing speed becomes slow.

With reference to FIG. 2, there is shown a split gate structure of another conventional flash memory cell. As shown in FIG. 2, a floating gate 23 and a control gate 24 are stacked in an insulating film formed on a semiconductor substrate with a source 21 and a drain 22 at a considerable distance away the source 21, and a selecting gate 25 is formed entirely over the substrate. This conventional flash memory cell with such split gate structure is designed to solve the problem of overerasure in which the channel region controlled by the selecting gate 25 is present on the side of the source 21.

Accordingly, the problem of overerasure can be avoided even easier in the flash memory cell having the spilt gate structure than in those having the stack gate structure. However, the flash memory cell having the split gate structure occupies relatively large area. Another significant problem of the flash memory cell having the split gate structure is that, since high voltages are used upon programming or erasing information, the reliability is degraded. In addition, the triplicate polysilicon give a high step which makes the fabricating processes difficult.

SUMMARY OF THE INVENTION

Accordingly, it is an object of the present invention to provide a flash memory cell preventive of overerasure, thereby eliminating false operations.

It is another object of the present invention to provide a flash memory cell capable of programming and erasing at low voltages.

It is a further object of the present invention to provide a flash memory cell employing bulk erasure mode.

It is still another object of the present invention to provide a method for fabricating the flash memory cell.

It is still a further object of the present invention to provide an array method of the flash memory cell.

In accordance with one aspect of the present invention, there is provide a flash memory cell, comprising: a composite insulating film formed on a substrate at a predetermined size which charges are trapped or detrapped; a drain formed at one side of said composite insulating film; a source formed a predetermined distance away the other side of said composite insulating film; a program/erasure gate formed on said composite insulating film; an interlayer insulating film for covering said drain, said source and said program/erasure gate; a selecting gate formed on said interlayer insulating film.

In accordance with another aspect of the present invention, there is provide a method for arraying flash memory cells each of which comprises a composite insulating film formed on a substrate at a predetermined size which charges are trapped or detrapped, a drain formed at one side of the composite insulating film, a source formed a predetermined distance away the other side of the composite insulating film, a program/erasure gate formed on the composite insulating film, an interlayer insulating film for covering the drain, the source and the program/erasure gate, a selecting gate formed on the interlayer insulating film, comprising the steps of: forming an array of said drains into a bit line; forming a source line and a program/erasure gate line in the direction of said bit line; forming one of said segmented composite insulating films for each of cells under said program/erasure gate line; and forming an array of said selecting gates into a word line.

In accordance with a further object of the present invention, there is provide a method for fabricating a flash memory cell, comprising the steps of: patterning a composite insulating film on a substrate; patterning a first conductive film on said composite insulating film; forming buried regions of high concentration ion each in an area of said substrate at one side of said composite insulating film and in another area of said substrate at a predetermined distance away the other side of said composite insulating film for each; and patterning a second conductive film on said interlayer insulating film.

BRIEF DESCRIPTION OF THE DRAWINGS

The above objects and other advantages of the present invention will become more apparent by describing in detail the preferred embodiments of the present invention with reference to the attached drawings in which:

FIG. 6 is a table showing an example of the operation in the circuit of FIG. 5;

DETAILED DESCRIPTION OF THE PREFERRED EMBODIMENTS

Figure 1:
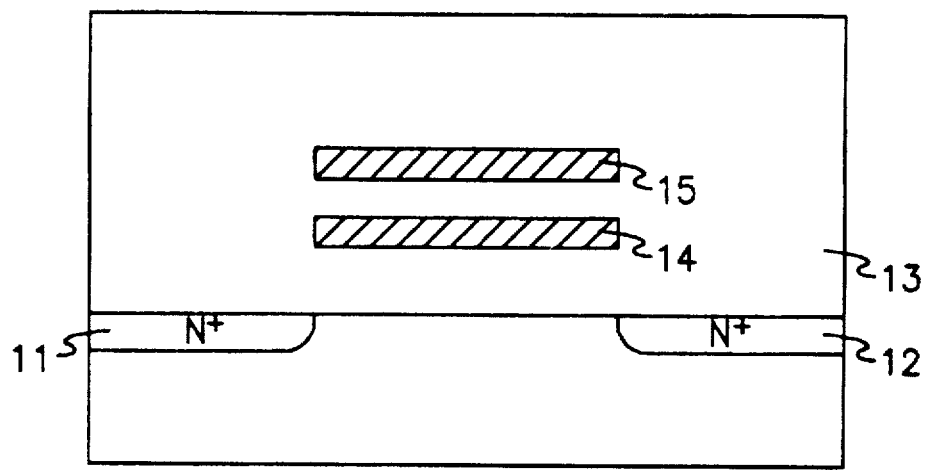
FIG. 1 is a schematic cross sectional view showing a conventional flash memory cell with a stack gate structure.
Figure 2:
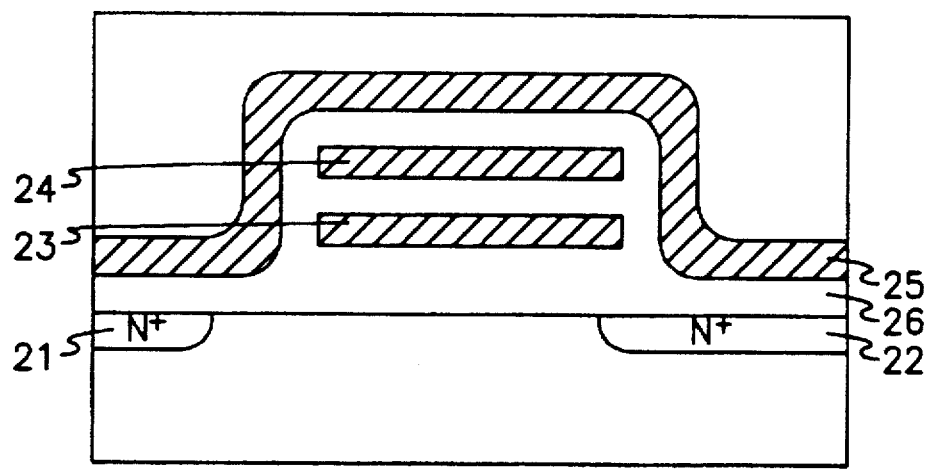
FIG. 2 is a schematic cross sectional view showing a conventional flash memory cell with a split gate structure.

The application of the preferred embodiments of the present invention is best understood with reference to the accompanying drawings, wherein like reference numerals are used for like and corresponding parts, respectively.

Figure 3:
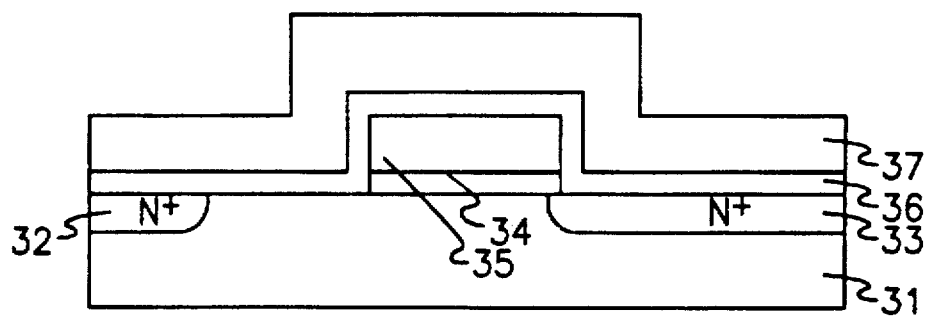
FIG. 3 is a schematic cross sectional view showing a flash memory cell according to the present invention.

Referring to FIG. 3, there is shown the structure of the flash memory cell of the present invention. As shown in this figure, two layers of polysilicon 35 and 37 are formed over a P-type well 31 formed in an N-type silicon substrate. While the first polysilicon layer 35 is a program/erasure gate, which serves as the main gate when programming and erasing, the second polysilicon layer 37 is a selecting gate 37, which is used to efficiently separate a cell to be read or programmed from other cells.

The program/erasure gate 35 is formed on a composite insulating layer, e.g. oxide-nitride-oxide (hereinafter referred to as "ONO") layer 34 which traps or detraps carriers at the boundary between the oxide and the nitride, causing a program state or an erasure state.

An insulating film 36 which electrically separates the selecting gate 37 from the program/erasure gate 35 and the P-type well 31 is typically made of silicon oxide ($SiO_2$) and has a thickness enough to endure about 10 volts.

In order to program the cell, a positive voltage (+Vcc) is first applied to the program/erasure gate 35 while applying a negative voltage (–Vcc) to the well 31, the source 32 and the drain 33, to generate a tunneling through the ONO layer 34. In the meanwhile, negative charge carriers are trapped at the boundary between the nitride and oxide of the ONO layer 34, increasing the threshold voltage ($V_t$). On the other hand, erasure is achieved by detrapping the trapped negative charge carriers through the application of a negative voltage to the program/erasure gate 35 and a positive voltage to the well, the source and the drain. In the meanwhile, a tunneling is generated through the ONO layer 34 and positive charge carriers are trapped at the boundary between the oxide and nitride of the ONO layer 34.

Figure 4:
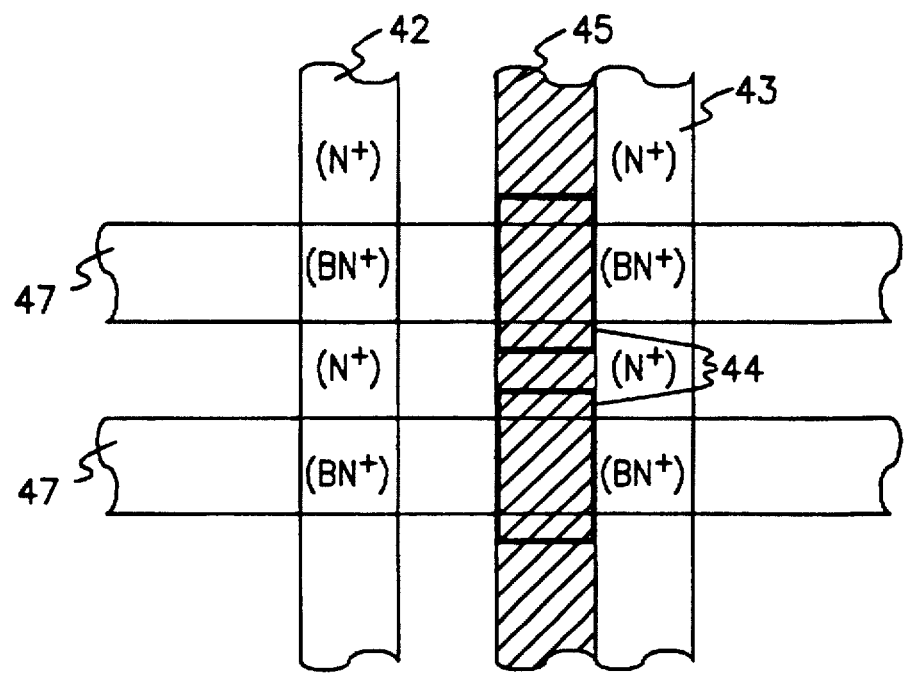
FIG. 4 is a layout of cell array using the flash memory cells of the present invention.

With reference to FIG. 4, there is shown a cell array using the flash memory cell of the present invention. A drain diffusion layer 43 is formed as a bit line, so as to make the best use of the area in the cell array. In the direction of a source line 42 and a drain line 43, that is, in the direction of the bit line, a polysilicon layer 45 for a program/erasure gate is formed, under which a segmented ONO layer 44 is formed for each of cells. A plurality of polysilicon layers 47 for selecting gates are formed as word lines in the ordinary direction, that is, perpendicular to the bit line.

Figure 5:
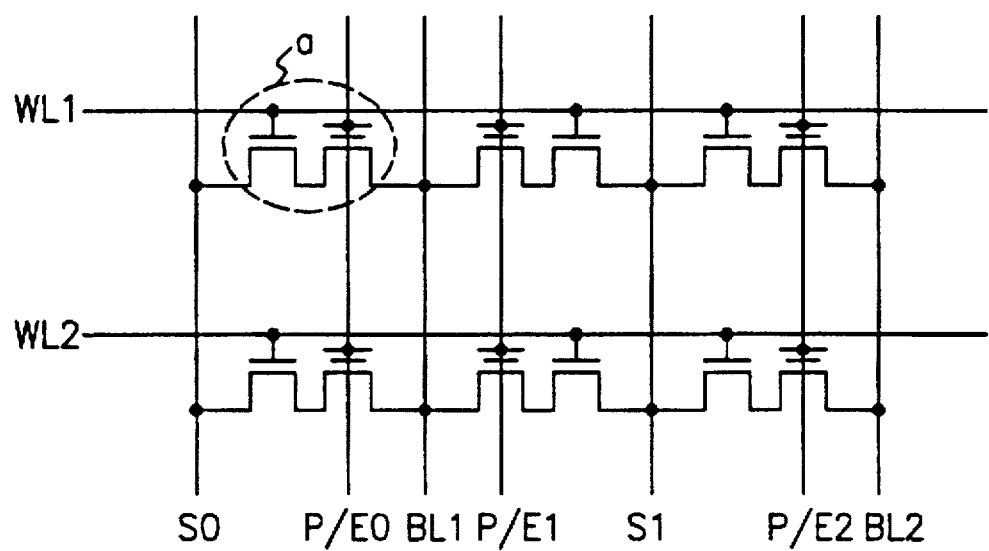
FIG. 5 is a circuit diagram equivalent to the cell array of FIG. 6.

FIG. 5 is a circuit diagram showing the cell array of FIG. 4 in which two transistors denoted by "a" is an equivalent of the memory device. In this figure, both of WL1 and WL2 stand for the word line (selecting gate line), that is, the second polysilicon layer of FIG. 4, all of P/E0, P/E1 and P/E2 for the program/erasure gate line, that is, the first polysilicon layer of FIG. 4, and both of BL1 and BL2 for the drain line, that is, the bit line of FIG. 4.

It should be noted that this cell array structure, free of typical bit line contact, is very advantageous in reducing the area of the array.

FIG. 6 shows an example of operating such a circuit as is shown in FIG. 5.

For program operation, the word line WL1 of a cell located at a desired address is applied with a positive voltage (Vcc) while earthing the other word line WL2. At the moment, the selecting gate is in ON state. In this state, if a negative voltage (–Vcc), for example, about –5 volts, is applied to the bit line BL1 and source line Si of a desired cell and the P well while a positive voltage (Vcc), for example, about 5 volts, is applied to a desired program line P/E1, the cell is programmed. In the meanwhile the bit line BL2, the source line S2 and the program line P/E2 in undesired cells earths in order to prevent the undesired cells from being programmed. Herein, it should be noted that the P-well is biased to –Vcc.

Upon erasure, Vcc is applied to all of the selected bit line (BL1), the selected source line S1 and the P well under the condition that the word lines within a sector including desired cells have Vcc. In this state application of –Vcc to the selected program/erasure gate line P/E1 forces all the cells of the selected sector to be subjected to erasure. In contrast with the selected cells, the unselected cells brings the bit line BL2 and the source line S2 into the earth level, like the program/erasure gate line P/E2.

In order to read information, Vcc is first applied to a selected word line WL1 as well as a selected program/erasure gate line P/E1. A selected source line S1 is applied with a power of 1 to 2 volts while bringing a bit line into the earth level. In this state the stored information can be read by detecting the conductivity of the selected cells with an ordinary sense circuit. Unselected cells can be subjected to the non-operating state by bringing the word line, bit line and source line, and program/erasure gate line into the earth level. But, it is needed that the bit line of a cell located at the right of the selected source line is made to be in a floating state or applied with an appropriate vias, to maximize the sensing power to the selected cells.

FIG. 7 shows the preferred process steps of fabricating a flash memory cell in the word line direction, according to one embodiment of the present invention. These steps will be in detail described in connection with FIGS. 7A through 7E.

Figure 7A:
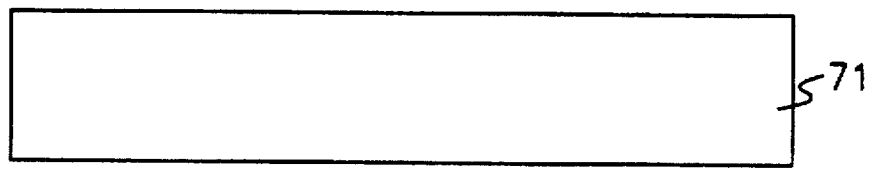
FIGS. 7A through 7E are schematic cross sectional views a process for fabricating the flash memory cell of the invention in the word line direction.

First, FIG. 7A is a cross section of a P-well 71 formed on a semiconductor substrate (not shown).

Figure 7B:
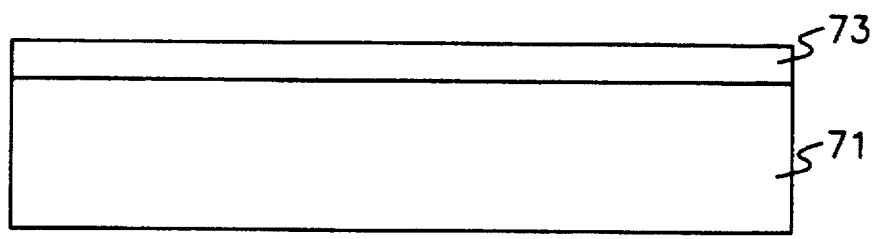

Next, FIG. 7B is a cross section after an ONO film 73 is formed.

Figure 7C:
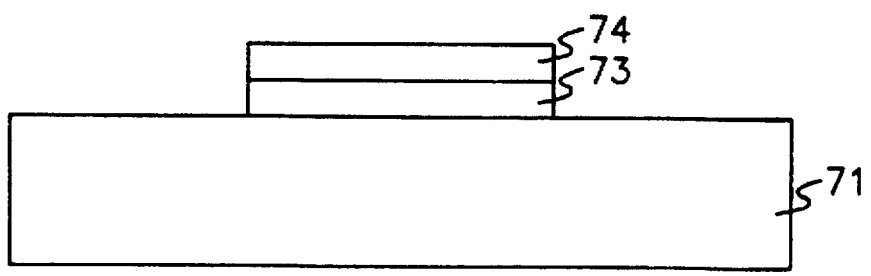

FIG. 7C is a cross section after a first polysilicon film 74 for a program/erasure gate is formed entirely over the ONO film 73, followed by the patterning of the first polysilicon film 74 and the ONO film 73.

Figure 7D:
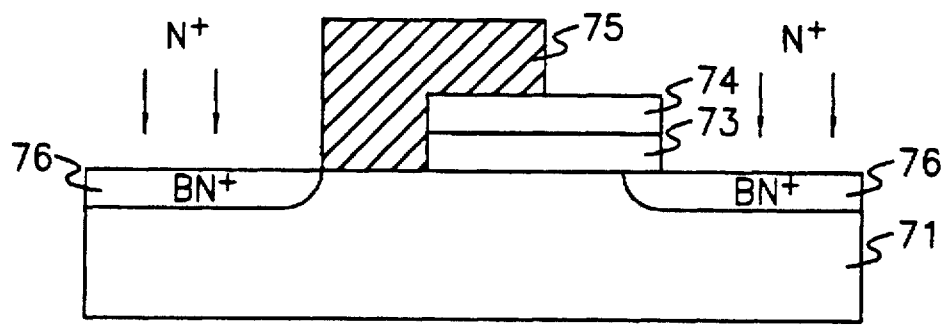

FIG. 7D is a cross section after a photosensitive film pattern 75 is formed on one side of the patterned polysilicon film 74, followed by the implantation of a high concentration of N type impurities as indicated by arrows. The photosensitive film pattern 75 is made by forming a blanket photosensitive film over the resultant structure and then, by subjecting the film to photolithography. As the result of the ion implantation, a buried $N^+$ region 76 is formed in the P-well 71.

Figure 7E:
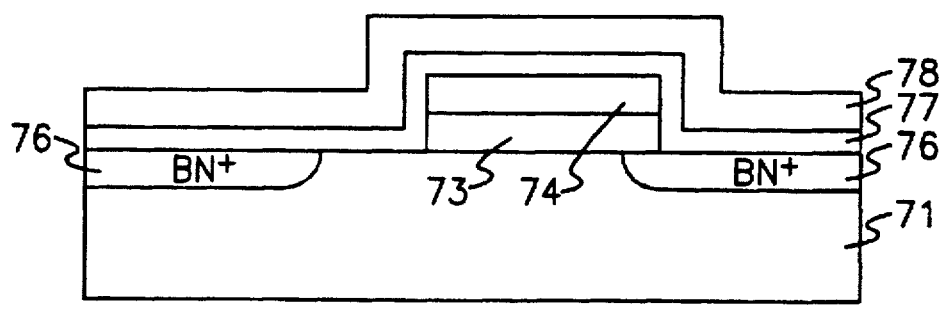

Finally, FIG. 7E is a cross section after a silicon oxide film 77 which will serve as an interlayer insulating film, and a second polysilicon film 78 for a word line-selecting gate are sequentially formed over the resulting structure and patterned.

Thereafter, typical process steps including formation of source/drain may be carried out.

FIG. 8 show the preferred process steps of fabricating a flash memory cell in the bit line direction, according to another embodiment of the present invention, whose details be described with reference to FIGS. 8A through 8E.

Figure 8A:
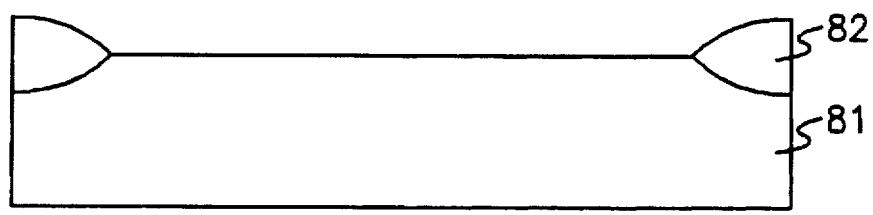
FIGS. 8A through 8E are schematic cross sectional views a process for fabricating the flash memory cell of the invention in the bit line direction.

First, referring to FIG. 8A, there is shown a P-well 81 with a field oxide film 82 which is formed on a semiconductor substrate (not shown).

Figure 8B:
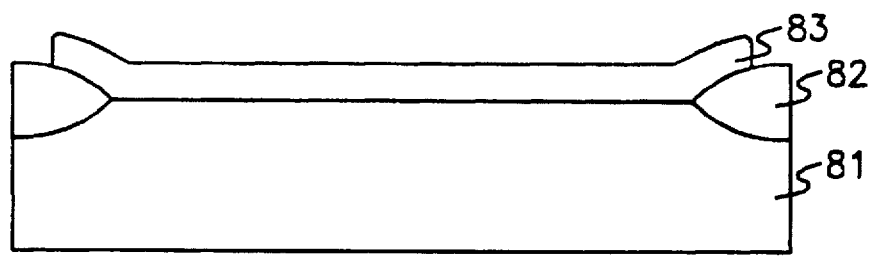

Next, FIG. 8B is a cross section after an ONO film 83 is formed and then patterned.

Figure 8C:
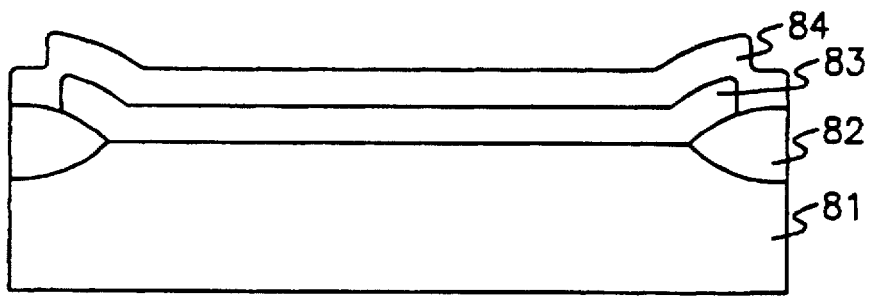

Fig. 8C is a cross section after a first polysilicon film 84 for a program/erasure gate is formed entirely over the resulting structure and then, patterned.

Figure 8D:
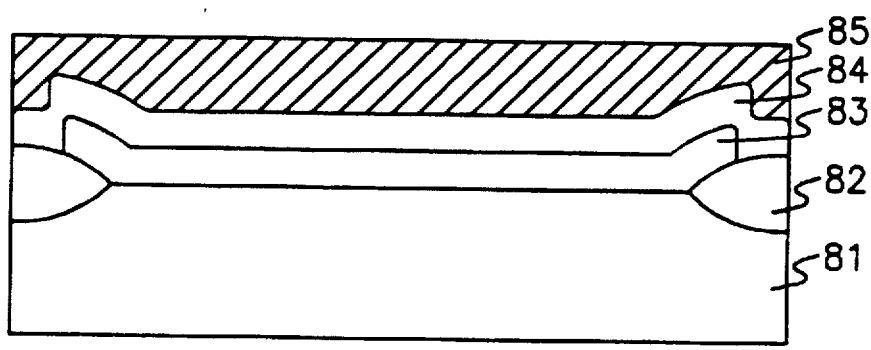

FIG. 8D is a cross section after a photosensitive film pattern 85 is formed by depositing a blanket photosensitive film over the resultant structure and then, subjecting the film to photolithography.

Figure 8E:
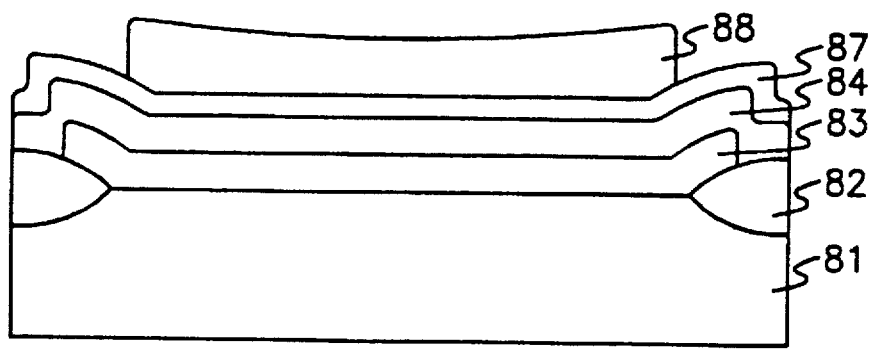

Finally, FIG. 8E is a cross section after a silicon oxide film 87 which will serve as an interlayer insulating film, and a second polysilicon film 88 for a word line-selecting gate are sequentially formed over the resulting structure and patterned.

As described hereinbefore, the flash memory cell according to the present invention is able to program and erase information at low voltages. Accordingly, it can be operated by application of a single power system In addition, the low voltages allow peripheral circuit to be designed easily and the chip size to be reduced. Further, the repeating number of the programming and erasing can be markedly increased since the flash memory cell of the present invention employs a channel erasure manner as well as low powers. A problem of overerasure does not arise in the flash memory cell, which thus can erase information more quickly. Furthermore, the flash memory cell is relatively even in topology, to which processing difficulty is low owing.

Other features, advantages and embodiments of the invention disclosed herein will be readily apparent to those exercising ordinary skill after reading the foregoing disclosures. In this regard, while specific embodiments of the invention have been described in considerable detail, variations and modifications of these embodiments can be effected without departing from the spirit and scope of the invention as described and claimed.

What is claimed is:

1. A method for manufacturing a flash memory device comprising the steps of:

providing a substrate;

forming on said substrate a multi-layer insulating film for trapping and detrapping charges and having at least one interface;

forming a first gate electrode on said multi-layer insulating film for injecting hot electrons from said substrate into the interface in said multi-layer insulating film, and for erasing the hot electrons stored in the interface by adjusting the voltage applied to said first gate electrode;

forming a source region and a drain region in said substrate, wherein said source region is apart from said first gate electrode;

forming an interlayer insulating film over said first gate electrode and said source and drain regions; and forming a second gate electrode on said interlayer insulating film.

2. The method in accordance with claim 1 wherein said multi-layer insulating film is an oxide-nitride-oxide film.

3. The method in accordance with claim 1 wherein each of said first and second gate electrode comprises a polysilicon film.

4. The method in accordance with claim 1 wherein said multi-layer insulating film is thick enough to maintain its insulating property at 10 volts.

5. A method for programming the flash memory device manufactured according to claim 1, by applying approximately 5 volts to said first gate electrode and said second gate electrode so that said hot electrons are stored in said multi-layer insulating film.

6. The method for programming the flash memory device in accordance with claim 5 wherein said hot electrons are stored in said multi-layer insulating film by applying approximately −5 volts to said source region, said drain region, and said substrate.

7. A method for programming the flash memory device manufactured in accordance with claim 1 by erasing said hot electrons stored in said multi-layer insulating film by applying approximately −5 volts to said first gate electrode and by applying approximately 5 volts to said second gate electrode.

8. The method for programming the flash memory device in accordance with claim 7 wherein said hot electrons stored in said multi-layer insulating film are erased by applying approximately 5 volts to said drain region, said source region, and said substrate.

9. A method for reading information from a flash memory device manufactured according to claim 1 comprising the step of applying approximately 5 volts to said first gate electrode and said second gate electrode.

10. The method for reading information from a flash memory device in accordance with claim 9 wherein approximately 0 volts are applied to said drain region and approximately 1 volt is applied to said source region to read out information from said device.

* * * * *